United States Patent
Oyama

(10) Patent No.: US 8,974,600 B2
(45) Date of Patent: Mar. 10, 2015

(54) DEPOSIT PROTECTION COVER AND PLASMA PROCESSING APPARATUS

(75) Inventor: Toshihiko Oyama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 959 days.

(21) Appl. No.: 12/843,149

(22) Filed: Jul. 26, 2010

(65) Prior Publication Data

US 2011/0024040 A1   Feb. 3, 2011

Related U.S. Application Data

(60) Provisional application No. 61/238,266, filed on Aug. 31, 2009.

(30) Foreign Application Priority Data

Jul. 28, 2009   (JP) .................. 2009-175777

(51) Int. Cl.
  *C23C 16/44* (2006.01)
  *H01J 37/32* (2006.01)

(52) U.S. Cl.
  CPC ..... *H01J 37/32477* (2013.01); *H01J 37/32091* (2013.01); *Y10S 156/916* (2013.01)
  USPC ............. 118/715; 118/504; 156/916

(58) Field of Classification Search
  CPC   C23C 16/44; C23C 16/4401; C23C 16/4404; H01J 37/32477; H01J 37/32495; H01J 37/32504; Y10S 156/916
  USPC ............ 118/715, 504; 156/916; 438/731
  See application file for complete search history.

(56) References Cited

U.S. PATENT DOCUMENTS

| | | | | |
|---|---|---|---|---|
| 3,719,578 | A | * | 3/1973 | Berthoux et al. ............. 204/252 |
| 5,605,637 | A | * | 2/1997 | Shan et al. ....................... 216/71 |
| 5,641,375 | A | * | 6/1997 | Nitescu et al. ............. 156/345.1 |
| 6,170,429 | B1 | * | 1/2001 | Schoepp et al. .......... 118/723 R |
| 2001/0032590 | A1 | * | 10/2001 | Carducci et al. .......... 118/723 E |
| 2004/0060657 | A1 | * | 4/2004 | Saigusa et al. ............. 156/345.1 |
| 2004/0060658 | A1 | * | 4/2004 | Nishimoto et al. ........ 156/345.1 |
| 2006/0037701 | A1 | * | 2/2006 | Koshiishi et al. ........ 156/345.44 |
| 2006/0151114 | A1 | * | 7/2006 | Fink ......................... 156/345.29 |

FOREIGN PATENT DOCUMENTS

| | | | | |
|---|---|---|---|---|
| JP | 04214898 | A | * | 8/1992 |
| JP | 05125541 | A | * | 5/1993 |
| JP | 09283450 | A | * | 10/1997 |
| JP | 2008-270595 | A | | 11/2008 |

* cited by examiner

*Primary Examiner* — Jeffrie R Lund
*Assistant Examiner* — Yuechuan Yu
(74) *Attorney, Agent, or Firm* — Pearne & Gordon LLP

(57) ABSTRACT

A deposit protection cover and a plasma processing apparatus provide a simple solution to deposits adhered to a portion originally considered to be unreachable by plasma without increasing manufacturing cost. The deposit protection cover is detachably installed within a processing chamber for processing a substrate by generating plasma therein so as to cover a preset portion of the processing chamber. The cover includes an aluminum plate having a surface on which an anodic oxidation process is performed. Further, the anodic oxidation process is performed by using an electrode part protruded from a cover main body, an exposed area of an aluminum base surface is reduced by removing the electrode part after the anodic oxidation process is performed, and a cut surface formed after removing the electrode part is positioned at a region that is not directly exposed to the plasma within the processing chamber.

3 Claims, 5 Drawing Sheets

DEPOSIT PROTECTION COVER AND PLASMA PROCESSING APPARATUS

CROSS-REFERENCE TO RELATED APPLICATION

This application claims the benefit of Japanese Patent Application No. 2009-175777 filed on Jul. 28, 2009, and U.S. Provisional Application Ser. No. 61/238,266 filed on Aug. 31, 2009, the entire disclosures of which are incorporated herein by reference.

FIELD OF THE INVENTION

The present disclosure relates to a deposit protection cover and a plasma processing apparatus.

BACKGROUND OF THE INVENTION

Conventionally, in the field of manufacture of semiconductor devices or the like, there is known a plasma processing apparatus that processes a target substrate such as a semiconductor wafer by generating plasma within a hermetically sealable processing chamber. Further, there is known a plasma etching apparatus as one example of such a plasma processing apparatus.

In such a plasma etching apparatus or the like, plasma etching may cause deposits to adhere on the inside of the processing chamber. The deposits may be peeled off from the inside of the processing chamber and, then, the deposits may be dispersed as particles and be adhered to a semiconductor wafer on which an etching process is being performed. To prevent this problem, conventionally, the inside of the processing chamber has been cleaned periodically.

Further, a cylindrical liner is installed so as to cover a wall surrounding a plasma generation space in the processing chamber, and, then deposits are removed from the inside of the processing chamber by regularly replacing or cleaning the liner after separating the liner (see, for example, Patent Document 1).

Patent Document 1: Japanese Patent Laid-open Publication No. 2008-270595

As stated above, conventionally, the cylindrical liner or the like covering the wall surrounding the plasma generation space has been installed and the liner has been regularly replaced or separated and cleaned.

However, deposits may be adhered not only to the plasma generation space of the processing chamber but also to a portion originally considered to be unreachable by plasma, such as a portion under a baffle plate configured to surround a mounting table for mounting a target substrate thereon and provided with a through hole, a slit, or the like through which a gas exhaust is performed. If deposits are adhered to such a portion and if it is difficult to separate and clean components of the processing chamber, it has been difficult to completely remove the deposits by performing a cleaning process within the processing chamber. Therefore, there has been a problem that it takes a long time to complete the cleaning process.

Furthermore, to install a detachable cover configured to cover such a portion, at least a surface of the cover needs to be made of an insulating material so as to prevent an abnormal electric discharge, and a highly plasma-resistance material should be used for the cover. Therefore, there has been a problem that manufacturing cost is increased.

BRIEF SUMMARY OF THE INVENTION

In view of the foregoing, in order to solve the above-mentioned problem, the present disclosure provides a deposit protection cover capable of providing a simple solution to deposits adhered to a portion originally considered to be unreachable by plasma without increasing manufacturing cost, and also provides a plasma processing apparatus using the same.

In accordance with a first embodiment of the present disclosure, there is provided a deposit protection cover detachably provided within a processing chamber so as to cover a preset portion of the processing chamber that processes a substrate by generating plasma therein. The cover includes an aluminum plate having a surface on which an anodic oxidation process is performed. Further, the anodic oxidation process is performed by using an electrode part protruded from a cover main body, an exposed area of an aluminum base surface is reduced by removing the electrode part after the anodic oxidation process is performed, and a cut surface formed after removing the electrode part is positioned at a region that is not directly exposed to the plasma within the processing chamber.

In accordance with a second embodiment of the present disclosure, there is provided a plasma processing apparatus including a processing chamber and processing a substrate by generating plasma therein. The apparatus includes a deposit protection cover made of an aluminum plate having a surface on which an anodic oxidation process is performed, and the cover is detachably provided within the processing chamber so as to cover a preset portion of the processing chamber. Further, the anodic oxidation process is performed by using an electrode part protruded from a cover main body, an exposed area of an aluminum base surface is reduced by removing the electrode part after the anodic oxidation process is performed, and a cut surface formed after removing the electrode part is positioned at a processing chamber's portion a region that is not directly exposed to the plasma within the processing chamber.

In accordance with the above-mentioned present disclosure, there are provided a deposit protection cover and a plasma processing apparatus capable of providing a simple solution to deposits adhered to the portion originally considered to be unreachable by plasma without increasing manufacturing cost.

BRIEF DESCRIPTION OF THE DRAWINGS

The disclosure may best be understood by reference to the following description taken in conjunction with the following figures.

DETAILED DESCRIPTION OF THE INVENTION

Hereinafter, embodiments of the present disclosure will be described with reference to the accompanying drawings.

Figure 1A:
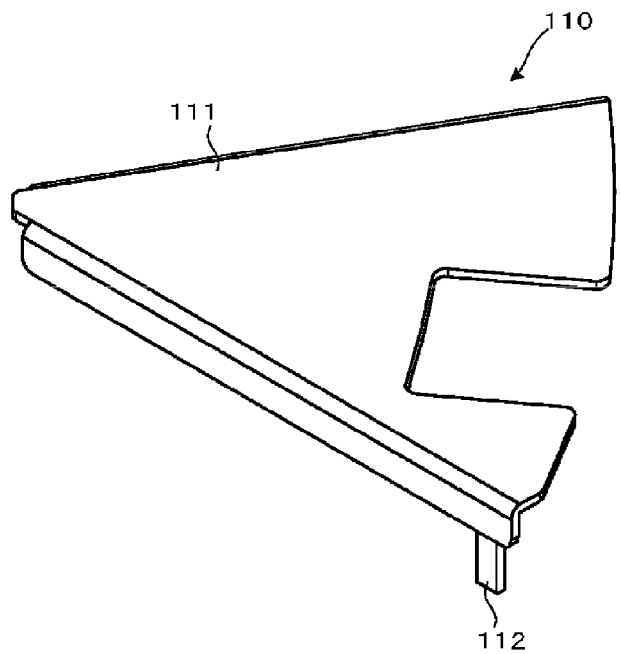
FIGS. 1A and 1B are schematic diagrams illustrating a configuration of a deposit protection cover in accordance with an embodiment of the present disclosure.
Figure 1B:
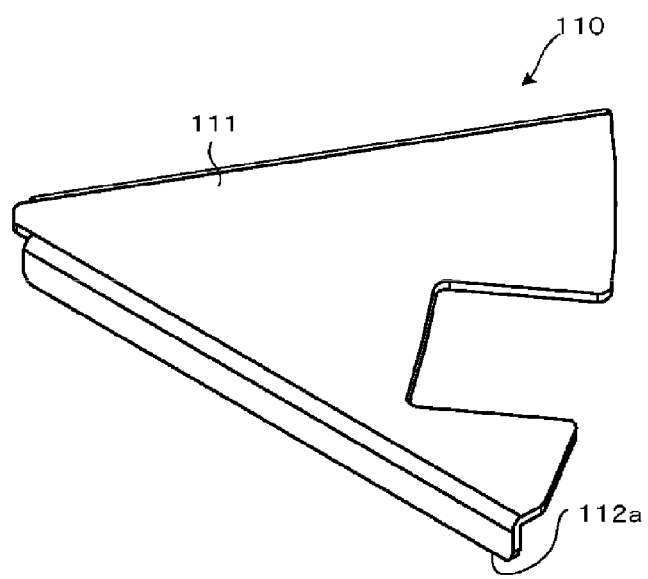

FIGS. 1A and 1B are diagrams for describing a configuration of a deposit protection cover 110 in accordance with an embodiment of the present disclosure. The deposit protection cover 110 shown in FIGS. 1A and 1B is made of an aluminum plate in a predetermined shape.

As illustrated in FIG. 1A, the deposit protection cover 110 in the middle of manufacture is provided with an electrode part 112 protruding from a cover main body 111 so as to be used when an anodic oxidation process is performed. An anodically oxidized film is formed on the cover main body 111 of the deposit protection cover 110 by performing the anodic oxidation process. Meanwhile, since the electrode part 112 is used as an electrode when the anodic oxidation process is performed, anodically oxidized film is not formed on its surface, and an aluminum base surface is just exposed.

Accordingly, in the embodiment shown in FIG. 1B, the electrode part 112 is removed after the anodic oxidation process is performed on the cover main body 111 of the deposit protection cover 110, and the deposit protection cover 110 is used without the electrode part 112.

Accordingly, in a state shown in FIG. 1B, an aluminum base surface is exposed only at a cut surface 112a formed after the electrode part 112 is removed. As compared to a state before the removal of the electrode part 112 of FIG. 1A, an exposed area of the aluminum base surface is reduced. Further, the cut surface 112a is formed so as to be positioned at a portion which is not directly exposed to plasma when the deposit protection cover 110 is provided within a processing chamber of a plasma etching apparatus or the like, as will be described later. By the deposit protection cover 110 in such a state, a risk of an abnormal electric discharge can be reduced.

Furthermore, by using the aluminum plate of which surface is anodically oxidized as state above, manufacturing cost can be reduced as compared to, e.g., a case of forming highly plasma-resistant fine ceramics on an entire metal plate by thermal spraying.

Figure 2:
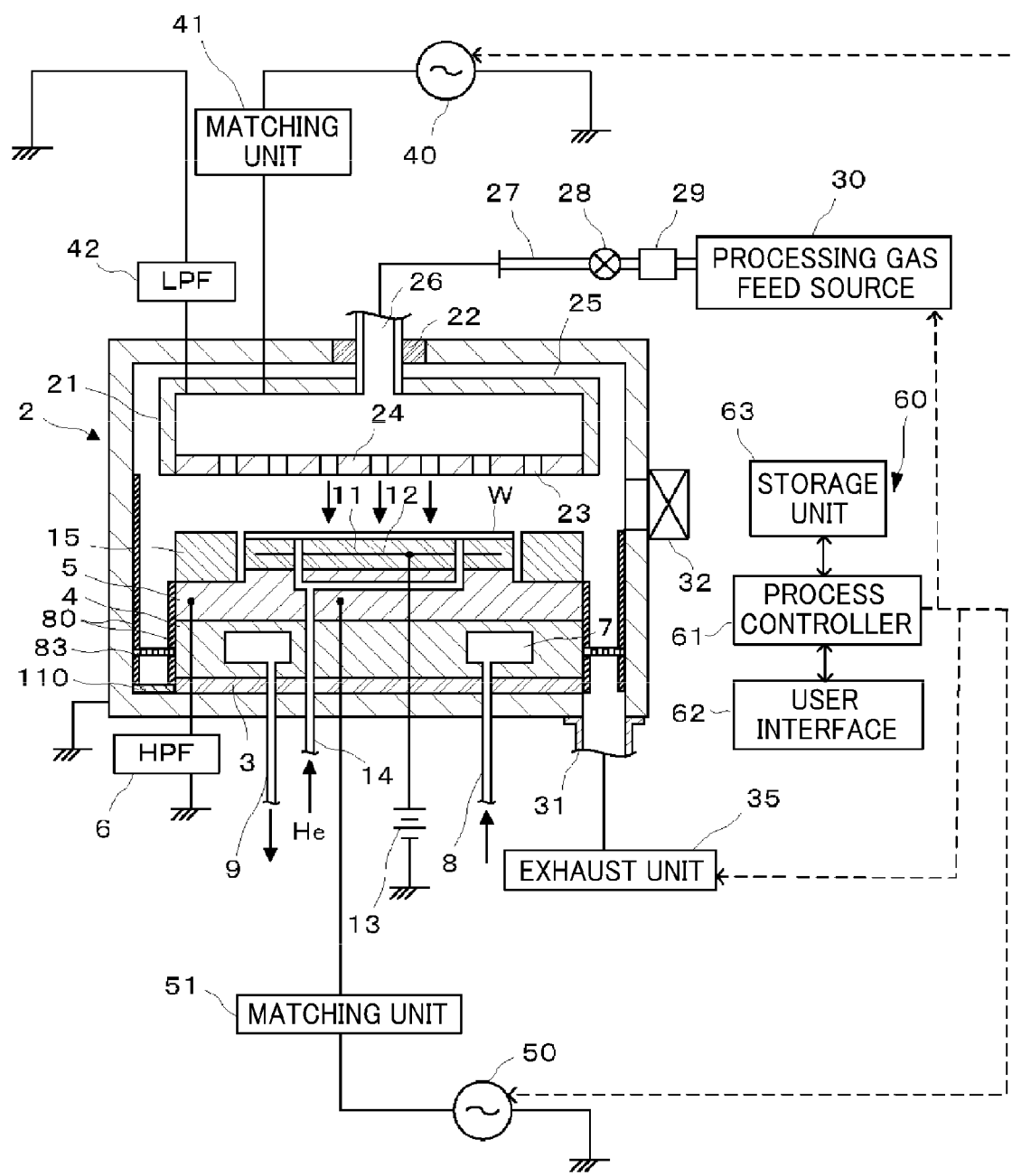
FIG. 2 is a schematic diagram illustrating a configuration of a plasma etching apparatus in accordance with an embodiment of the present disclosure.

Referring to FIG. 2, a configuration of a plasma processing apparatus (plasma etching apparatus in the present embodiment) in which the deposit protection cover 110 having the above-described configuration is provided will now be explained. The plasma etching apparatus includes a substantially cylindrical processing chamber 2 made of, e.g., aluminum of which surface is anodically oxidized. The processing chamber 2 is grounded.

A substantially cylindrical susceptor support 4 configured to mount a semiconductor wafer W thereon is installed at a bottom portion of the processing chamber 2 via an insulating plate 3 made of, e.g., ceramics. A susceptor (mounting table) 5 serving as a lower electrode is installed on the susceptor support 4. A high pass filter (HPF) 6 is connected with the susceptor 5.

A coolant path 7 is provided within the susceptor support 4, and a coolant is circulated through the coolant path 7 after introduced to a coolant introduction line 8 and is discharged through a coolant discharge line 9. A cold heat is transferred to the semiconductor wafer W via the susceptor 5, and, thus, the semiconductor wafer W may be adjusted to a desired temperature.

The susceptor 5 is formed in a circular plate shape having a protruded upper central portion, and a circular electrostatic chuck 11 having the substantially same diameter as that of the semiconductor wafer W is provided on the protruded upper central portion of the susceptor 5. The electrostatic chuck 11 includes an electrode 12 embedded in an insulating material. Further, a DC voltage of, e.g., about 1.5 kV is applied to the electrode 12 from a DC power supply 13, and, thus, the semiconductor wafer W can be electrostactically attracted and held by, e.g., Coulomb force.

A gas passage 14 for supplying a heat transfer medium (for example, a He gas) to a rear surface of the semiconductor wafer W is formed through the insulating plate 3, the susceptor support 4, the susceptor 5, and the electrostatic chuck 11. Cold heat of the susceptor 5 is transferred to the semiconductor wafer W through the heat transfer medium, and, thus, the semiconductor wafer W can be maintained at a preset temperature.

An annular focus ring 15 is provided at an upper peripheral portion of the susceptor 5 so as to surround the semiconductor wafer W mounted on the electrostatic chuck 11. The focus ring 15 is made of a conductive material such as silicon and can improve etching uniformity.

An upper electrode 21 is provided above the susceptor 5, facing the susceptor 5 in parallel. The upper electrode 21 is held on an upper portion of the processing chamber 2 via an insulating member 22. The upper electrode 21 includes an electrode plate 24; and an electrode support 25 made of a conductive material and configured to hold the electrode plate 24. The electrode plate 24 is made of a semiconductor or a conductor, such as Si or SiC, and has a plurality of discharge holes 23. The electrode plate 24 forms a facing surface toward the susceptor 5.

A gas inlet port 26 is provided in a center of the electrode support 25 of the upper electrode 21, and a gas feed pipe 27 is coupled to the gas inlet port 26. Further, the gas feed pipe 27 is connected with a processing gas feed source 30 via a valve 28 and a mass flow controller 29. The processing gas feed source 30 feeds an etching gas for a plasma etching process.

An exhaust pipe 31 is coupled to a bottom portion of the processing chamber 2, and the exhaust pipe 31 is connected with an exhaust unit 35. The exhaust unit 35 includes a vacuum pump such as a turbo-molecular pump and serves to evacuate the inside of the processing chamber 2 to a preset pressure of, e.g., about 1 Pa or less. Therefore, the exhaust unit 35 can create a preset depressurized atmosphere within the processing chamber 2. Further, a gate valve 32 is provided at a side wall of the processing chamber 2. After the gate valve 32 is opened, the semiconductor wafer W may be transferred to/from an adjacent load-lock chamber (not illustrated).

The upper electrode 21 is coupled to a first high frequency power supply 40 via a matching unit 41. Further, the upper electrode 21 is also connected with a low pass filter (LPF) 42. The first high frequency power supply 40 has a frequency ranging from about 27 MHz to about 150 MHz. By applying a high frequency power in such a high frequency range, high-density plasma in a desirable dissociation state can be generated within the processing chamber 2.

The susceptor 5 serving as a lower electrode is coupled to a second high frequency power supply 50 via a matching unit 51. The second high frequency power supply 50 has a frequency lower than that of the first high frequency power supply 40. By applying a high frequency power in such a frequency range, an appropriate ionic action can occur without inflicting damage on the semiconductor wafer W serving as a target substrate. Desirably, the frequency of the second high frequency power supply 50 may be in the range of, e.g., about 1 MHz to about 20 MHz.

Further, a deposit shield 80 may be detachably provided along an inner wall of the processing chamber 2 so as to prevent adhesion of an etching by-product (deposits) to the processing chamber 2. That is, the deposit shield 80 may form a processing chamber wall. The deposit shield 80 may be also provided at outer peripheral portions of the susceptor support 4 and the susceptor 5. Furthermore, in the vicinity of a bottom portion of the processing chamber 2, a baffle plate (exhaust plate) 83 may be provided between the deposit shield 80 on the processing chamber wall and the deposit shield 80 on the susceptor support 4. The deposit shields 80 and the baffle plate 83 can be fabricated by coating an aluminum material with ceramics such as $Y_2O_3$. The baffle plate 83 is provided with through holes or slits for gas exhaust. The baffle plate 83 can uniformly exhaust gas through a circular ring-shaped region around the susceptor 5 and be configured to suppress reaching of plasma into a downstream of the baffle plate 83.

Figure 3:
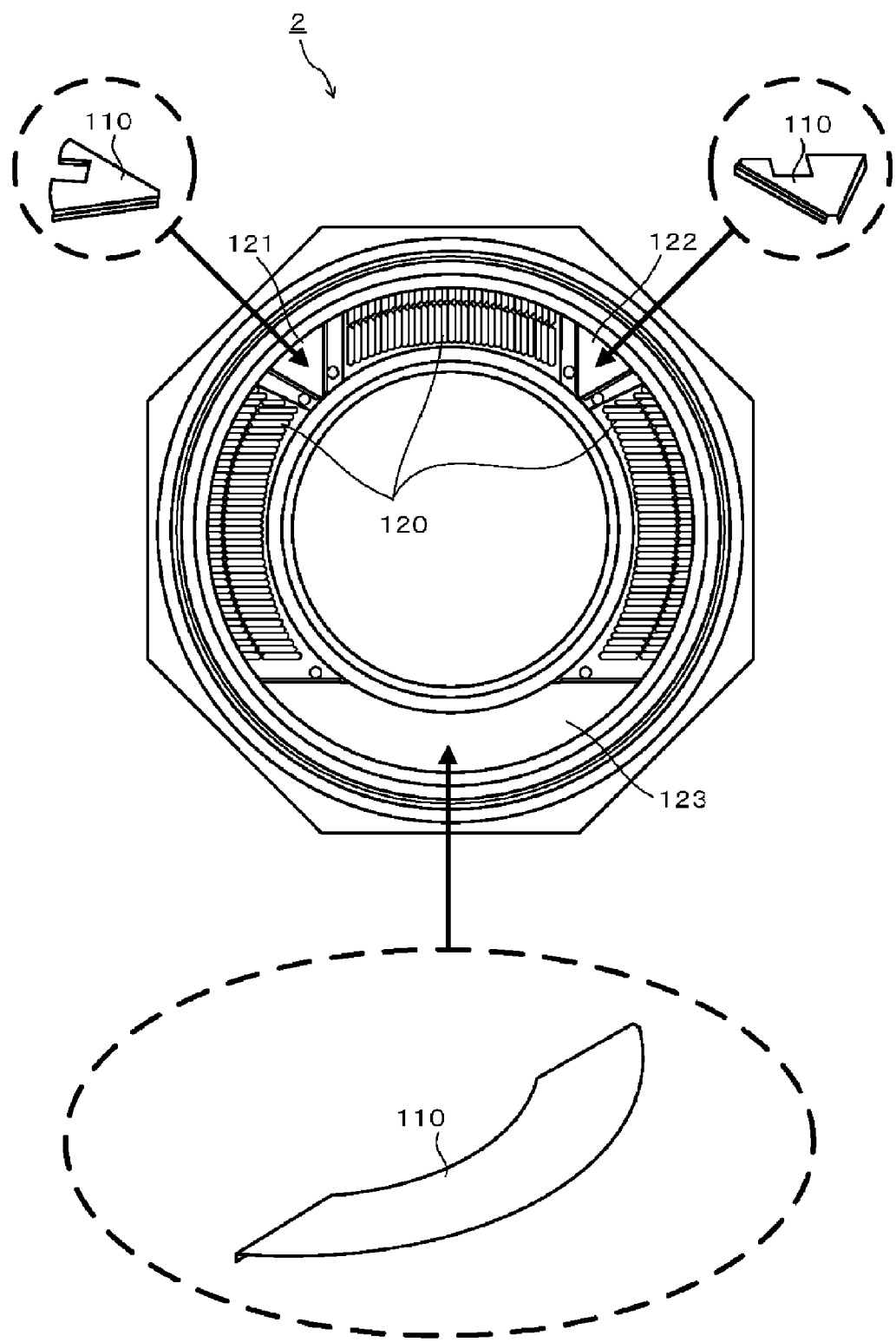
FIG. 3 is a schematic diagram illustrating a configuration of major parts of the plasma etching apparatus of FIG. 2.
Figure 4:
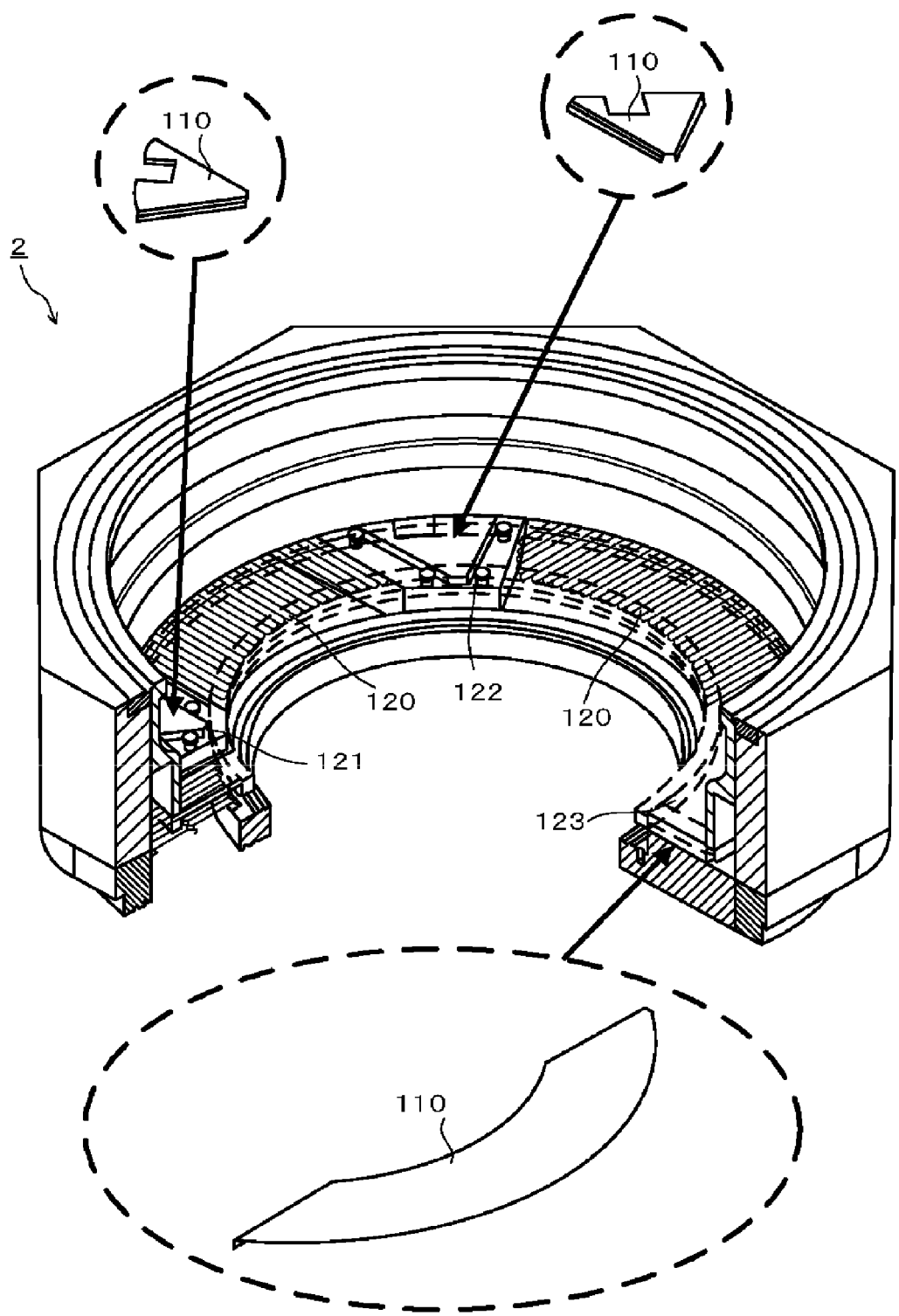
FIG. 4 is a schematic diagram illustrating a configuration of major parts of the plasma etching apparatus of FIG. 2.

In the present embodiment, a deposit protection cover 110 is provided so as to cover a certain portion below the baffle plate 83. That is, as shown in FIG. 3, besides exhaust path portions provided with exhaust paths 120, non-exhaust-path portions 121, 122 and 123 provided without exhaust path 120 exist below the ring-shaped baffle plate 83 due to structural restriction. The deposit protection covers 110 having shapes corresponding to the shapes of the non-exhaust-path portions 121, 122 and 123 are detachably installed at the respective non-exhaust-path portions 121, 122 and 123. Furthermore, FIG. 4 is a partial vertical sectional perspective view illustrating the processing chamber 2's part shown in FIG. 3.

Figure 5A:
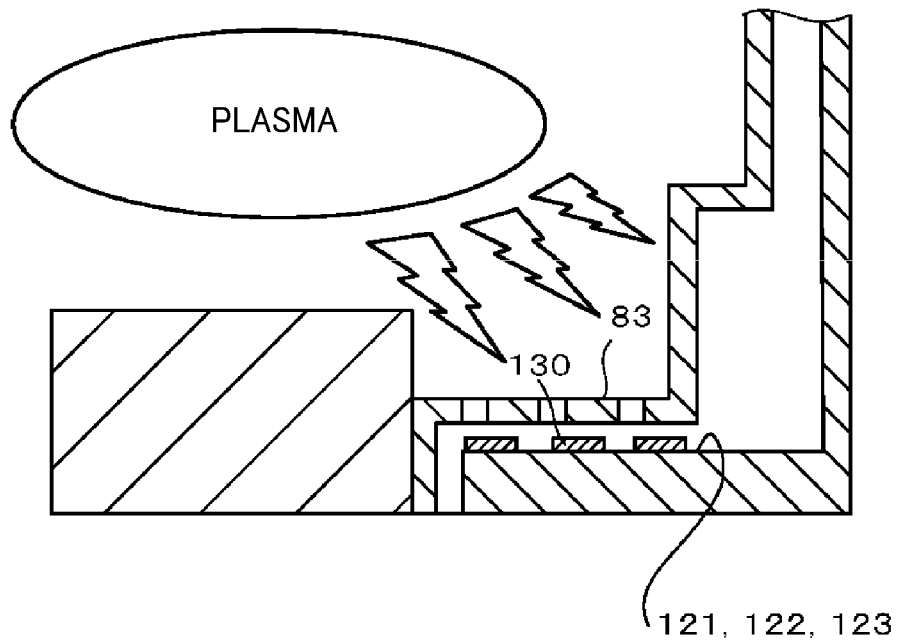
FIGS. 5A and 5B are diagrams for describing usage states of the deposit protection cover of FIGS. 1A and 1B.

As shown in FIG. 5A, depending on a process performed in the processing chamber 2, deposits may be adhered to the non-exhaust-path portions 121, 122 and 123 by, e.g., plasma that reaches the non-exhaust-path portions through the through holes of the baffle plate 83. Since, however, plasma typically does not reach the portions below the baffle plate 83, those portions have not been considered to be portions to which deposits are adhered. Thus, if deposits 130 are adhered to such portions, those portions cannot be separated to be cleaned. Therefore, when those portions in the narrow processing chamber 2 need be cleaned, it may take a long time to complete the cleaning and the deposits may not be completely removed.

Figure 5B:
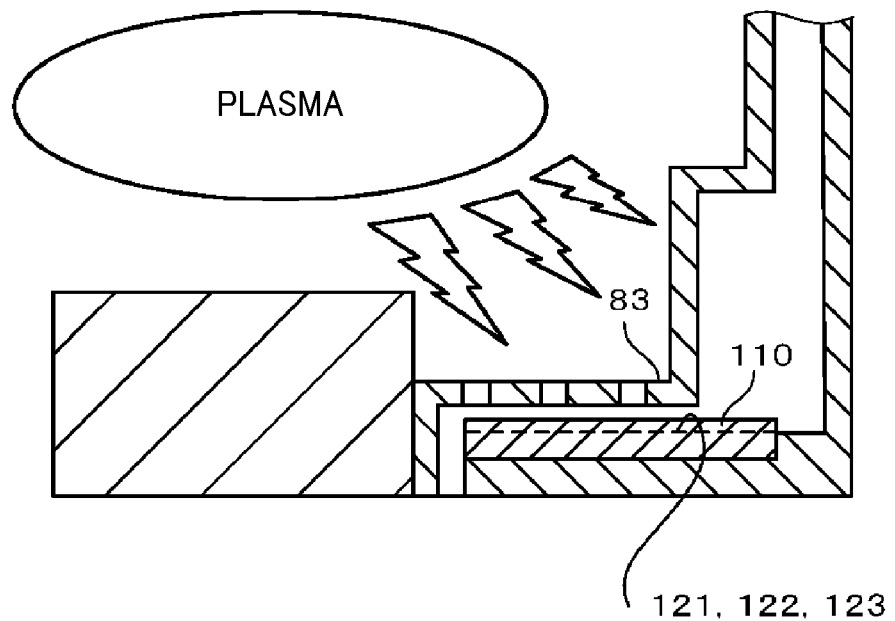

Meanwhile, in the present embodiment, as shown in FIG. 5B, since the non-exhaust-path portions 121, 122 and 123 are covered with the deposit protection covers 110, deposits, if any, may be adhered to the deposit protection covers 110, and the deposit protection covers 110 can be replaced or cleaned easily after separated.

The overall operation of the plasma etching apparatus configured as described above is controlled by a control unit 60. The control unit 60 includes a process controller 61 having a CPU for controlling each component of the plasma etching apparatus; a user interface 62; and a storage unit 63.

The user interface 62 includes a keyboard with which a process manager inputs commands to manage the plasma etching apparatus; and a display on which an operational status of the plasma etching apparatus is visually displayed.

The storage unit 63 stores therein control programs (software) for executing various processes in the plasma etching apparatus under the control of the process controller 61; and recipes including processing condition data or the like. A necessary recipe may be retrieved from the storage unit 63 and executed by the process controller 61 in response to an instruction from the user interface 62, and, thus, a desired process may be performed in the plasma etching apparatus under the control of the process controller 61. Furthermore, the control programs or the recipes including the processing condition data or the like can be retrieved from a computer-readable storage medium (e.g., a hard disk, a CD, a flexible disk, or a semiconductor memory), or can be used on-line by being transmitted from another apparatus via, e.g., a dedicated line, whenever necessary.

Before plasma etching is performed on a semiconductor wafer W by the plasma etching apparatus having the above-described configuration, the gate valve 32 is opened. Then, the semiconductor wafer W is loaded into the processing chamber 2 from a load-lock chamber (not shown) and mounted on the electrostatic chuck 11. Thereafter, a DC voltage is applied from the DC power supply 13, and, thus, the semiconductor wafer W is electrostatically attracted and held on the electrostatic chuck 11. Subsequently, the gate valve 32 is closed, and the inside of the processing chamber 2 is evacuated by the exhaust unit 35 to a preset vacuum pressure level.

Thereafter, the valve 28 is opened, and a preset etching gas is fed into a central portion of the upper electrode 21 through the gas feed pipe 27 and the gas inlet port 26 from the processing gas feed source 30 while its flow rate is controlled by the mass flow controller 29 and is uniformly discharged toward the semiconductor wafer W through the discharge holes 23 of the electrode plate 24, as indicated by arrows in FIG. 2.

Then, the inside of the processing chamber 2 is maintained at a preset pressure. Thereafter, a high frequency power of a preset frequency is applied to the upper electrode 21 from the first high frequency power supply 40. As a result, a high frequency electric field is generated between the upper electrode 21 and the susceptor 5 as the lower electrode, and the etching gas is dissociated and excited into plasma.

Meanwhile, a high frequency power of a frequency lower than that of the first high frequency power supply 40 is applied to the susceptor 5 serving as the lower electrode from the second high frequency power supply 50. As a result, ions in the plasma can be attracted toward the susceptor 5, so that etching anisotropy can be improved by ion assist.

Upon completing the plasma etching process, the supply of the high frequency power and the processing gas is stopped, and the semiconductor wafer W is unloaded from the processing chamber 2 in the reverse sequence as described above.

Although the embodiment of the present disclosure has been described in the above, the present disclosure is not limited to the above-stated embodiment but can be modified in various ways. For example, the plasma etching apparatus is not limited to the parallel plate type apparatus that applies dual frequency powers to the upper and lower electrodes as illustrated in FIG. 2. For example, the present disclosure is applicable to various kinds of plasma etching apparatuses such as a type that applies dual high frequency powers to a lower electrode or a type that applies a single high frequency power to a lower electrode, or applicable to various kinds of other plasma processing apparatuses.

What is claimed is:

1. A deposit protection cover detachably provided within a processing chamber so as to cover a preset portion of the processing chamber that processes a substrate by generating plasma therein, the cover comprising:

an aluminum plate having a surface on which an anodic oxidation process is performed; and an electrode detachment surface comprising an aluminum base surface that is exposed, wherein the aluminum base surface of the deposit protection cover is exposed only at the electrode detachment surface, wherein the aluminum plate has a plate portion and a protrusion portion which is extended downward from the plate portion in a vertical direction, the anodic oxidation process is performed by using an electrode part, protruded from a bottom of the protrusion portion at the electrode detachment surface, and then subsequently removed after the anodic oxidation process is performed, and the electrode detachment surface is positioned at a region that is not directly exposed to the plasma within the processing chamber, wherein the preset portion is a non-exhaust-path portion of a bottom surface of the processing chamber that does not provide an exhaust path below a baffle plate for gas exhaust, the baffle plate being configured to surround a mounting table that mounts thereon the substrate within the processing chamber, the preset portion is under deposit shields formed on a sidewall of the processing chamber and on a sidewall of the mounting table, and an exhaust-path portion of the bottom surface of the processing chamber that provides the exhaust path and the non-exhaust-path portion form a ring-shaped surface of the processing chamber around the mounting table.

2. The deposit protection cover of claim 1, wherein the preset portion includes an inseparable part of the processing chamber.

3. A plasma processing apparatus including a processing chamber and processing a substrate by generating plasma therein, the apparatus comprising:

a deposit protection cover made of an aluminum plate having a surface on which an anodic oxidation process is performed, the cover being detachably provided within the processing chamber so as to cover a preset portion of the processing chamber, wherein the deposit protection cover comprises an electrode detachment surface comprising an aluminum base surface that is exposed, wherein the aluminum base surface of the deposit protection cover is exposed only at the electrode detachment surface, wherein the aluminum plate has a plate portion and a protrusion portion which is extended downward from the plate portion in a vertical direction, the anodic oxidation process is performed by using an electrode part protruded from a bottom of the protrusion portion at the electrode detachment surface, and then subsequently removed after the anodic oxidation process is performed, and the electrode detachment surface is positioned at a region that is not directly exposed to the plasma within the processing chamber, wherein the preset portion is a non-exhaust-path portion of a bottom surface of the processing chamber that does not provide an exhaust path below a baffle plate for gas exhaust, the baffle plate being configured to surround a mounting table that mounts thereon the substrate within the processing chamber, and an exhaust-path portion of the bottom surface of the processing chamber that provides the exhaust path and the non-exhaust-path portion form a ring-shaped surface of the processing chamber around the mounting table.

* * * * *